(12) United States Patent
Hsieh et al.

(10) Patent No.: US 7,799,654 B2
(45) Date of Patent: Sep. 21, 2010

(54) REDUCED REFRACTIVE INDEX AND EXTINCTION COEFFICIENT LAYER FOR ENHANCED PHOTOSENSITIVITY

(75) Inventors: Yuan-Chih Hsieh, Hsin-Chu (TW); Chung-Yi Yu, Hsin-Chu (TW); Tsung-Hsun Huang, Chungho (TW); Tzu-Hsuan Hsu, Kaohsiung (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 787 days.

(21) Appl. No.: 11/291,880

(22) Filed: Dec. 1, 2005

(65) Prior Publication Data

US 2007/0048965 A1 Mar. 1, 2007

Related U.S. Application Data

(60) Provisional application No. 60/713,083, filed on Aug. 31, 2005.

(51) Int. Cl.
*H01L 21/76* (2006.01)
*H01L 31/062* (2006.01)
*H01L 31/111* (2006.01)
*H01L 27/148* (2006.01)
*H01L 29/768* (2006.01)

(52) U.S. Cl. .................. 438/417; 257/291; 257/292; 257/222

(58) Field of Classification Search .............. 438/417; 257/291, 234, 226, 186, 292, 222, 232, 225
See application file for complete search history.

(56) References Cited

U.S. PATENT DOCUMENTS

| 6,350,127 | B1 | 2/2002 | Chiang et al. | |
| 6,514,785 | B1 | 2/2003 | Chiang et al. | |
| 7,038,232 | B2 | 5/2006 | Yaung et al. | |
| 7,262,817 | B2 * | 8/2007 | Huibers | 348/771 |
| 2005/0062118 | A1 * | 3/2005 | Yaung et al. | 257/414 |
| 2006/0044429 | A1 * | 3/2006 | Toda et al. | 348/272 |
| 2007/0166965 | A1 * | 7/2007 | Tanaka et al. | 438/487 |
| 2007/0176622 | A1 * | 8/2007 | Yamazaki | 324/770 |

OTHER PUBLICATIONS

Fossum, Eric R., "CMOS Image Sensors: Electronic Camera-on-a-Chip", IEEE Transactions on Electron Devices, vol. 44, No. 10, Oct. 1997, pp. 1689-1698.
Wuu, Shou-Gwo, et al., "High Performance 0.25-um CMOS Color Imager Technology with Non-Silicide Source/Drain Pixel", International Electron Devices Meeting (IEDM), 2000, pp. 705-708.
Chinese Patent Office, Office Action mailed Dec. 21, 2007, Application No. 2006101288613, 12 pages.

* cited by examiner

*Primary Examiner*—Chuong A. Luu
(74) *Attorney, Agent, or Firm*—Haynes and Boone, LLP

(57) ABSTRACT

An image sensor device includes a semiconductor substrate and a plurality of pixels on the substrate. An etch-stop layer is formed over the pixels and has a thickness less than about 600 Angstroms. The image sensor device further includes an interlayer dielectric (ILD) overlying the etch stop layer. The etch-stop layer has a refractive index less than about 2 and an extinction coefficient less than about 0.1.

23 Claims, 3 Drawing Sheets

REDUCED REFRACTIVE INDEX AND EXTINCTION COEFFICIENT LAYER FOR ENHANCED PHOTOSENSITIVITY

BACKGROUND

This patent claims the benefit of U.S. Ser. No. 60/713,083 filed Aug. 31, 2005, which is hereby incorporated by reference.

An image sensor provides a grid of pixels, such as photosensitive diodes or photodiodes, reset transistors, source follower transistors, pinned layer photodiodes, and/or transfer transistors for recording an intensity or brightness of light on the diode. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor.

The light received by a pixel is often based on the three primary colors: red, green, and blue (RGB). With these three primary colors, additional colors can be identified and/or created with various combinations and intensities (e.g., when red and green overlap they form yellow). However, it is generally noted that pixel sensitivity for blue light is innately worse than green and red light.

This problem is exacerbated in deep sub-micron technology. For example, it is often desired in deep sub-micron technology to utilize a silicon nitride or oxynitride layer to act as a borderless etch-stop layer. However, such a layer causes destructive interference because of the refractive index difference between different films. The difference of refractive index in such film stack will seriously degrade the photo response of the sensor, especially for blue light.

What is needed is a method and device for making a sensor with an improved response for all colors, including blue light.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
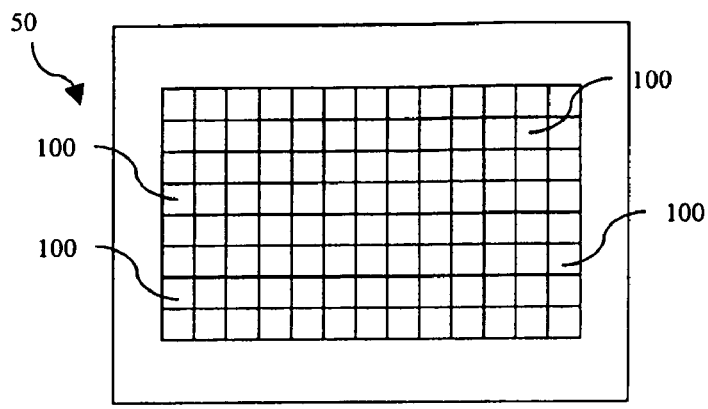
FIG. 1 is a top view of a sensor device including a plurality of pixels, according to one or more embodiments of the present invention.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid of pixels 100. In the present embodiment, the pixels 100 are photosensitive diodes or photodiodes, for recording an intensity or brightness of light on the diode. Other types of pixels include reset transistors, source follower transistors, pinned layer photodiodes, and transfer transistors. Common types of sensors include a charge-coupled device (CCD) or complimentary metal oxide semiconductor (CMOS) image sensor. Additional circuitry and input/outputs are typically provided adjacent to the grid of pixels 100 for providing an operation environment for the pixels and for supporting external communications with the pixels.

Figure 2A:
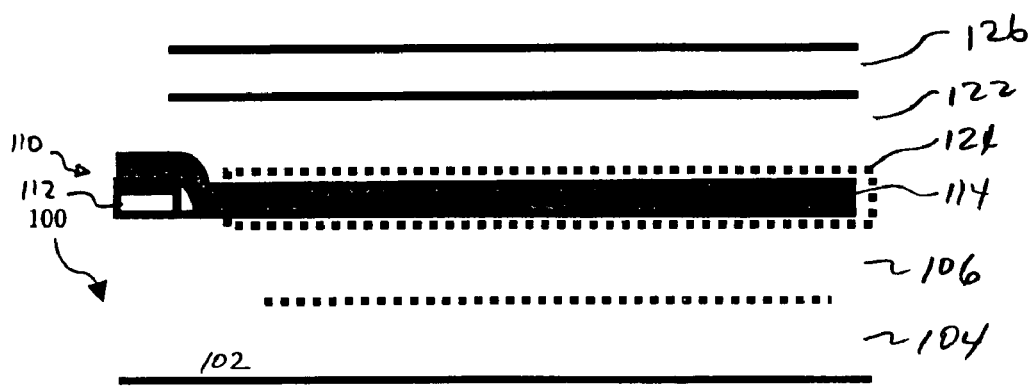
FIGS. 2a and 2b are side, cross-sectional views of pixels that can be used in the sensor device of FIG. 1.

Referring to FIG. 2a, illustrated is a cross-sectional view of one embodiment of a pixel 100, in this case a photodiode. The photodiode 100 is formed on a silicon substrate 102. The substrate 102 includes a P-type doping 104 and an N-type well 106 formed in the substrate. It is understood that many different embodiments could also be provided, such as different types of semiconductor material, different combinations of material (e.g., silicon-on-insulator), different dopings (e.g., a P-type well in an N-type doping area), and so forth, as is well known in the art. The combination of the two opposing dopant types (P-type and N-type) form the photodiode.

The photodiode 100 is shown adjacent to a transistor device 110. In furtherance of the present example, the transistor device 110 includes a gate stack 112 and is covered by an etch-stop layer 114. The etch-stop layer can be a layer of silicon nitride (SiN), silicon oxynitride (SiON), and various other materials known in the art. The etch-stop layer 114 extends over the photodiode 100 and will be discussed in greater detail below.

Above the etch-stop layer is an inter-level dielectric (ILD) oxide 122. Although these layers are shown and described as being adjacent to each other, there can be embodiments in which one or more of the layers/structures may not exist and embodiments in which one or more intermediate layers exists. Also, the ILD 122 can be constructed of various other non-conductive materials.

The ILD 122 may be formed by CVD, PVD, ALD, spin-on coating, and/or other proper methods. The ILD 122 may have a multilayer structure including a planarization layer, color filter layer, and/or a spacer layer in one example. The color filter layer can support several different color filters (e.g., red, green, and blue), and may be positioned such that the incident light is directed thereon and there through. In one embodiment, such color-transparent layers may comprise a polymeric material (e.g., negative photoresist based on an acrylic polymer) or resin. The color filter layer may comprise negative photoresist based on an acrylic polymer including color pigments. The spacer layer is formed to adjust the distance between the overlying microlens array and the underlying pixels 100 (and/or photodiodes 100). In one embodiment, the ILD 122 has a thickness ranging between about 0.2 μm and 50 μm.

Positioned above the ILD 122 is one or more lenses 126. In one embodiment, the lenses 126 include a microlens array, with individual microlenses positioned above corresponding photodiodes 100. One example of a system and method for forming microlenses is shown in U.S. Ser. No. 11/064,452, which is hereby incorporated by reference.

In some embodiments, a contact hole can be formed in the ILD oxide 122 to further expose the substrate and the photodiode 100.

In the present example, the refractive index (RI) of the ILD oxide 122 is about 1.46. Conventionally, the RI for the etch-stop layer 114 is about 2.10. As a result, the region identified by a dotted box 124 provides destructive interference of light, especially of blue light. As will be discussed in greater detail below, the present embodiments reduce the amount of destructive interference by modifying the RI of the etch-stop layer 114.

Figure 2B:
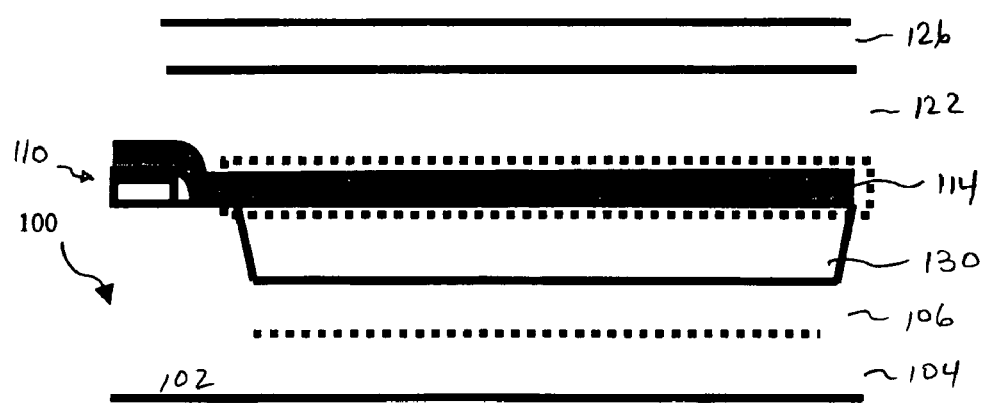

Referring to FIG. 2b, in another embodiment, the pixel 100 is similar to the photodiode shown in FIG. 2a, except that the photodiode is formed under a shallow trench isolation (STI) oxide region 130. In the present example, the STI oxide region 130 is formed by PECVD/LPCVD silicon oxide and has a RI of about 1.46, similar to that of the ILD oxide 122.

Figure 3:
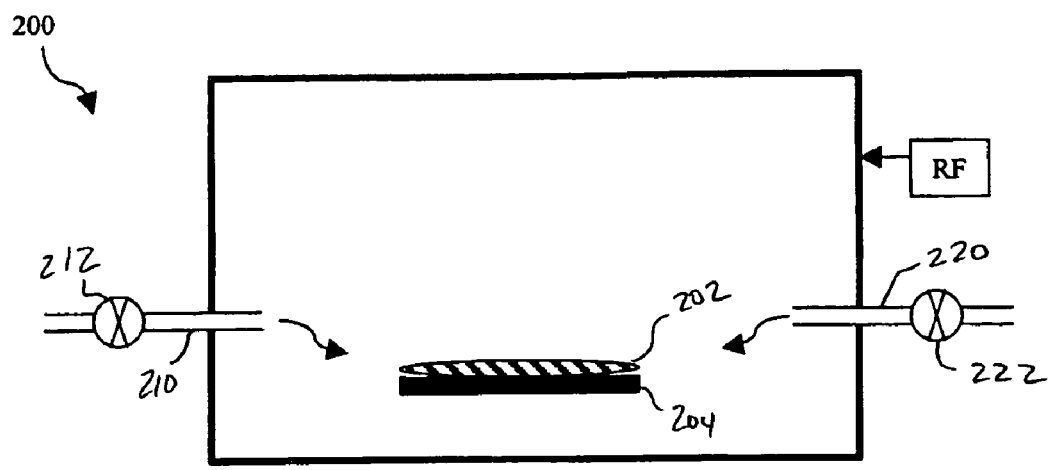
FIG. 3 is a sectional view of a processing chamber for fabricating the sensor of FIG. 1.

Referring to FIG. 3, a processing chamber 200 can be used to form the etch-stop layer 114 on the sensor 50 (FIG. 1), which is further located on a wafer 202. The wafer 202 is placed on a chuck 204, and is positioned within an interior of the chamber 200. The chamber 200 is used for plasma-enhanced chemical vapor deposition (PECVD), although other deposition processes, as well as other layer-forming or modifying processes, can be used.

The processing chamber 200 includes one or more material inlets 210, 220 each with a valve 212, 222, respectively, for controlling a flow rate of materials to be provided during the PECVD process. The materials and their corresponding flow rates can be used to control the composition and thickness of the etch-stop layer 114 (FIG. 1) being deposited, and may include silane ($SiH_4$), nitrous oxide ($N_2O$), ammonia ($NH_3$), nitrogen ($N_2$), and so forth. In addition, a radio frequency (RF) power supply is used to control the PECVD process. In one embodiment the etch stop layer 114 is a silicon nitride layer having substantially less silicon than a stoichiometric silicon nitride level. In another embodiment, the etch stop layer 114 is a silicon oxynitride layer having substantially less silicon than a stoichiometric silicon oxynitride level In the present example, it is desired to reduce the RI of the etch-stop layer 114 to be below 2.10, more preferably to an amount that is closer to that of the STI oxide region 130 (RI=1.46) and/or the ILD layer 122 (RI=1.46). Further, it is desired to reduce the extinction coefficient of the etch-stop layer 114 to below 0.1 at the wavelength for blue light (around 450nm-500 nm).

The thickness of the etch-stop layer 114 can be modified by controlling certain parameters in the layer's formation process. In the present PECVD example, the silane flow-rate and the ammonia flow-rate were modified to produce different thicknesses of the etch-stop layer 114. It is understood that factors such as gas kind, gas flow rate, RF power, chamber pressure, and so forth can be used to modify the formation of the etch-stop layer 114 in a manner that achieves the desired reduction in refractive index and extinction coefficient. It is also understood that the discussion of silane and nitrous oxide pertain to the present example, and that other materials can be used and/or modified as needed.

Figure 4A:
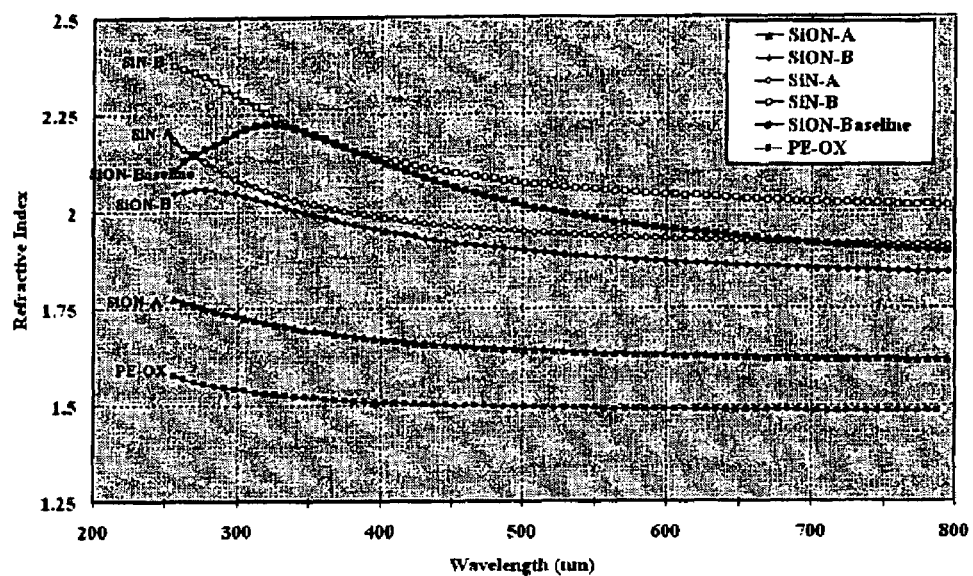
FIG. 4a is a graph comparing a refractive index of a pixel, vs. a wavelength of incoming light.
Figure 4B:
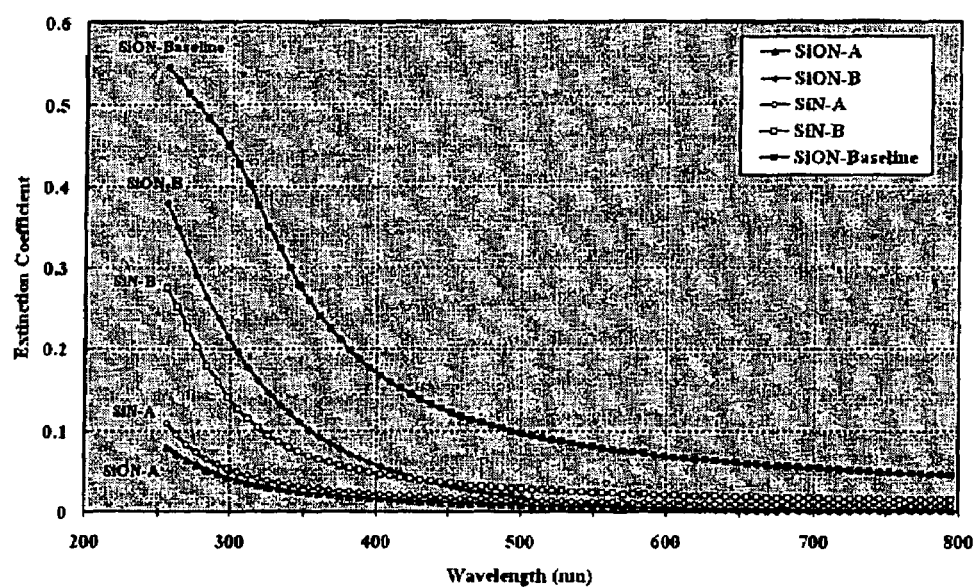
FIG. 4b is a graph comparing an extinction coefficient of a pixel, vs. a wavelength of incoming light.

The graph at FIG. 4a shows the refractive index for various samples of the etch-stop layer 114, as modified by one or more of the above-listed factors—SiON-A, SiON-B, SiN-A, SiN-B, and PE-OX. The refractive index is shown for different wavelengths of light from 300-800 nm. The graph at FIG. 4b shows the extinction coefficient for various samples of the etch-stop layer 114, as modified by one or more of the above-listed factors. The extinction coefficient is shown for different wavelengths of light from 300-800 nm.

Figure 5:
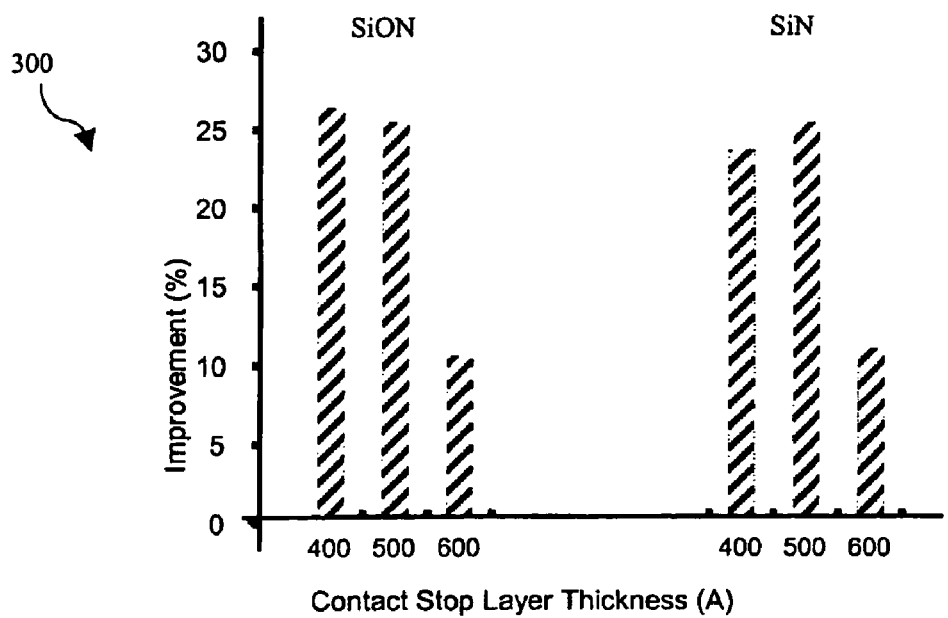
FIG. 5 is a graph of different layer thicknesses of an etch stop layer according to various embodiments of the present invention.

Referring to FIG. 5, a graph 300 compares various thickness for the etch-stop layer 114 to illustrate the amount of improvement seen in the RI for blue light. It was noticed that when the SiON etch-stop layer 114 had a thickness of about 400A, an improvement of about 25% was achieved for the photodiode 10's sensitivity to blue light. Furthermore, the photodiode's sensitivity to green light remained about the same and the photosensitivity to red light saw a modest improvement. To achieve this level of thickness, the silane flow-rate was reduced and the nitrous oxide flow rate was increased over a predetermined conventional rates.

It was further noticed that when the SiN etch-stop layer 114 had a thickness of about 500A, an improvement of almost 25% was achieved for the photodiode's sensitivity to blue light. Furthermore, the photodiode's sensitivity to green light remained about the same and the photosensitivity to red light saw a modest improvement. To achieve this level of thickness, the silane flow-rate was reduced and the ammonia flow rate was increased over a predetermined rate. As discussed above, it is understood that the flow rates depend on various factors, including equipment type, and one of skill in the art can modify the flow-rates and/or other parameters of the process to achieve the desired thickness. Even the samples that had a thickness of about 600A showed improvement.

The improvement in photosensitivity is also shown by a change in V/lux-s sensitivity. Table 1 below shows that the sensitivity improvement of the etch-stop layer 114 over a prior art (baseline) layer. Thus, by reducing the thickness of the etch-stop layer 114 to an amount below 600A, more preferably between 400-500A, the blue light sensitivity of the photodiode 100 (FIG. 1) improves without any detrimental affect to the green light sensitivity or the red light sensitivity.

TABLE 1

| Sensitivity (V/lux-s) | Baseline | Optimized | Improvement % |
| --- | --- | --- | --- |
| Blue | 0.714 | 0.84 | 18 |
| Green | 1.01 | 1.04 | 3 |
| Red | 1.13 | 1.12 | −1 |

Thus in one embodiment, an image sensor device is described. The image sensor device includes a semiconductor substrate and a plurality of pixels on the substrate. The pixels can be photodiodes or various other devices. An etch-stop layer is formed over the pixels, wherein the etch-stop layer has a refractive index between about 1.5 and 1.85, when measured at a wavelength of about 4000 to 5000 Angstroms.

Additional embodiments of the image sensor are also described. For example, an image sensor device includes a semiconductor substrate and a plurality of pixels on the substrate. An etch-stop layer is formed over the pixels, wherein the etch-stop layer has an extinction coefficient less than about 0.1, when measured at a wavelength of about 4000 to 5000 Angstroms.

In some embodiments, the etch-stop layer has a thickness less than about 1000 angstroms or less than about 600 angstroms. In some embodiments, the etch-stop layer comprises at least one from the group of nitrogen and carbon. Further examples of the etch-stop layer include silicon oxide, silicon nitride, and silicon oxynitride.

In some embodiments, the image sensor device includes a plurality of color filters, such as a red, green, and blue filter. In some embodiments, the image sensor device further includes a plurality of microlenses over the color filters.

In yet another embodiment of the image sensor, the image sensor device includes a semiconductor substrate and a plurality of pixels on the substrate. An etch-stop layer is formed over the pixels and has a thickness less than about 600 Angstroms. The image sensor device further includes an interlayer dielectric (ILD) overlying the etch stop layer.

In some embodiments, the etch-stop layer has a refractive index less than 2 and in some embodiments, the etch-stop layer has an extinction coefficient less than 0.1.

In some embodiments, the etch-stop layer comprises silicon nitride with less silicon than in a stoichiometric silicon nitride layer. In some embodiments, the etch-stop layer comprises silicon oxynitride with less silicon than in a stoichiometric silicon oxynitride layer.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. For example, the etch-stop layer may have a greater thickness when it is initially formed, and then a reduced thickness due to a later processing operation. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device comprising:
a semiconductor substrate;
a plurality of pixels on the substrate; and
an etch-stop layer over the pixels
wherein the etch-stop layer has an extinction coefficient less than about 0.1, when measured at a wavelength of about 4000 to 5000 Angstroms.

2. The image sensor device of claim 1 wherein the etch-stop layer has a thickness less than about 1000 angstroms.

3. The image sensor device of claim 1 wherein the etch-stop layer has a thickness less than about 600 angstroms.

4. The image sensor device of claim 1 wherein the etch-stop layer comprises at least one from the group of nitrogen and carbon.

5. The image sensor device of claim 1 wherein the etch-stop layer comprises at least one from the group of silicon oxide, silicon nitride, and silicon oxynitride.

6. The image sensor device of claim 1 wherein the etch-stop layer is formed by a plasma-enhanced chemical vapor deposition process.

7. The image sensor device of claim 1 wherein the plurality of pixels are photodiodes.

8. The image sensor device of claim 1 wherein the plurality of pixels are from a group consisting of reset transistors, source follower transistors, pinned layer photodiodes, and transfer transistors.

9. An image sensor device comprising:
a semiconductor substrate;
a plurality of pixels on the substrate; and
an etch-stop layer over the pixels
wherein the etch-stop layer is constructed of a material that allows a relatively high level of transmission for radiation wavelengths of about 4000 to 5000 Angstroms, as compared to silicon oxide.

10. The image sensor device of claim 9,
wherein the etch-stop layer has a refractive index between about 1.5 and 1.85, when measured at a wavelength of about 4000 to 5000 Angstroms.

11. The image sensor device of claim 10 wherein the etch-stop layer has a thickness less than about 1000 angstroms.

12. The image sensor device of claim 10 wherein the etch-stop layer has a thickness less than about 600 angstroms.

13. The image sensor device of claim 10 wherein the etch-stop layer comprises at least one from the group of nitrogen and carbon.

14. The image sensor device of claim 10 wherein the etch-stop layer comprises at least one from the group of silicon oxide, silicon nitride, and silicon oxynitride.

15. The image sensor device of claim 10 wherein the etch-stop layer is formed by a plasma-enhanced chemical vapor deposition process.

16. The image sensor device of claim 10 wherein the plurality of pixels are photodiodes.

17. The image sensor device of claim 10 wherein the plurality of pixels are from a group consisting of reset transistors, source follower transistors, pinned layer photodiodes, and transfer transistors.

18. The image sensor device of claim 9 wherein the etch-stop layer overlying the pixels has a thickness less than about 600 Angstroms, and an interlayer dielectric (ILD) overlies the etch stop layer.

19. The image sensor device of claim 18 wherein the etch-stop layer has a refractive index less than 2.

20. The image sensor device of claim 18 wherein the etch-stop layer has a refractive index between about 1.5 and 1.85.

21. The image sensor device of claim 18 wherein the etch-stop layer has an extinction coefficient less than 0.1.

22. The image sensor device of claim 18 wherein the etch-stop layer comprises silicon nitride with less silicon than in a stoichiometric silicon nitride layer.

23. The image sensor device of claim 18 wherein the etch-stop layer comprises silicon oxynitride with less silicon than in a stoichiometric silicon oxynitride layer.

* * * * *